United States Patent
Honda

(10) Patent No.: US 7,501,350 B2
(45) Date of Patent: Mar. 10, 2009

(54) PLASMA PROCESSING METHOD

(75) Inventor: Masanobu Honda, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 62 days.

(21) Appl. No.: 11/266,232

(22) Filed: Nov. 4, 2005

(65) Prior Publication Data

US 2006/0096952 A1    May 11, 2006

Related U.S. Application Data

(60) Provisional application No. 60/635,620, filed on Dec. 14, 2004.

(30) Foreign Application Priority Data

Nov. 5, 2004    (JP) .............................. 2004-321872

(51) Int. Cl.
*H01L 21/469*    (2006.01)
*H01L 21/477*    (2006.01)

(52) U.S. Cl. ..................... 438/758; 438/778; 438/780; 438/790

(58) Field of Classification Search .................. None
See application file for complete search history.

(56) References Cited

U.S. PATENT DOCUMENTS

| 6,432,318 | B1 * | 8/2002 | Ding et al. ................... 216/67 |
| 6,465,359 | B2 * | 10/2002 | Yamada et al. .............. 438/706 |
| 6,562,720 | B2 * | 5/2003 | Thilderkvist et al. ........ 438/695 |
| 7,091,612 | B2 * | 8/2006 | Kumar et al. ................ 257/758 |
| 7,098,139 | B2 * | 8/2006 | Tabaru ....................... 438/706 |
| 2004/0161946 | A1 * | 8/2004 | Tsai et al. .................. 438/778 |

FOREIGN PATENT DOCUMENTS

| JP | 2001-267294 | 9/2001 |
| JP | 2002-134479 | 5/2002 |
| JP | 2004-006575 | 1/2004 |

\* cited by examiner

*Primary Examiner*—Duy-Vu N Deo
(74) *Attorney, Agent, or Firm*—Oblon, Spivak, McClelland, Maier & Neustadt, P.C.

(57)    ABSTRACT

Disclosed is a plasma processing method for processing a target object by using a plasma of a process gas containing a fluorocarbon compound. Used is a fluorocarbon compound having at least one triple bond within the molecule and at least one $CF_3$ group bonded by a single bond to the carbon atom forming the triple bond with the adjacent carbon atom such as 1,1,1,4,4,4-hexafluoro-2-butyne or 1,1,1,4,4,5,5,5-octafluoro-2-pentyne.

12 Claims, 9 Drawing Sheets

PLASMA PROCESSING METHOD

BACKGROUND OF THE INVENTION

1. Field of the Invention

The present invention relates to a plasma processing method, particularly, to a plasma processing method that can be applied to the etching process and the film-forming process included in the manufacturing process of a semiconductor device.

2. Description of the Related Art

Where a silicon oxide film such as a $SiO_2$ film formed on a target substrate to be processed is removed by a plasma etching process with a photoresist film used as a mask, it was customary to use a gas of a fluorocarbon compound (CF series gas) such as octafluoro cyclopentene (c-$C_5F_8$) or hexafluoro-1,3-butadiene (1,3-$C_4F_6$), as disclosed in, for example, Japanese Patent Disclosure (Kokai) No. 2002-134479 and Japanese Patent Disclosure (Kokai) No. 2001-267294.

However, the etching with a high selectivity ratio relative to the photoresist is required in recent years in accordance with progress in the reduction of the thickness of the photoresist mask. To be more specific, it is of high importance nowadays to increase the etching selectivity ratio of the silicon oxide film relative to the photoresist film, i.e., the ratio of the etching rate of the silicon oxide film to the etching rate of the photoresist film. However, the etching gas of c-$C_5F_8$ described in the Japanese Patent Disclosure (Kokai) No. 2002-134479 and the etching gas of 1,3-$C_4F_6$ described in the Japanese Patent Disclosure (Kokai) No. 2001-267294 were not sufficiently satisfactory in terms of the etching selectivity ratio of the silicon oxide film relative to the photoresist film.

A serious problem is brought about in the case of using c-$C_5F_8$ or 1,3-$C_4F_6$ as the etching gas. Specifically, if the flow rate of the etching gas is increased in an attempt to increase the etching rate, a by-product is deposited within the etching hole so as to gradually lower the etching rate, with the result that the etching is stopped finally.

On the other hand, known is the technology of forming an amorphous CF film ($\alpha$-CF film) having a low-dielectric constant on a silicon substrate or on an insulating film such as a $SiO_2$ film by CVD (Chemical Vapor Deposition) using a CF series gas such as c-$C_5F_8$. However, in the case of using the conventional CF series gas, the deposition rate was not sufficiently high, leading to the demands for the technology that permits forming a film at a sufficiently high deposition rate.

BRIEF SUMMARY OF THE INVENTION

A first object of the present invention is to provide an etching method that permits etching a silicon oxide film by using a CF series gas with a high etching selectivity ratio relative to the photoresist film. Also, a second object of the present invention is to provide a CVD film-forming method that permits forming an $\alpha$-CF film at a high deposition rate.

In order to achieve the objects described above, the present invention according to a first aspect provides a plasma processing method comprising:

processing a target object by using a plasma generated by a process gas containing a fluorocarbon compound, wherein said fluorocarbon compound has at least one triple bond within the molecule and at least one $CF_3$ group bonded by a single bond to the carbon atom forming the triple bond with the adjacent carbon atom.

In the plasma processing method according to the first aspect of the present invention, it is desirable for the plasma processing to be applied to the selective etching of a silicon-containing oxide film formed on the target object, the selective etching being performed by using as an etching mask a patterned photoresist film formed on the silicon-containing oxide film. In this case, it is desirable for the etching selectivity ratio of the silicon-containing oxide film relative to the photoresist film to fall within a range of 4.8 to 6. Also, it is desirable for the residence time of the process gas in the etching treatment to fall within a range of 0.01 to 0.1 second. Further, it is desirable for the fluorocarbon compound used to consist of 1,1,1,4,4,4-hexafluoro-2-butyne. It is also desirable for the process gas to further contain a single or a plurality of rare gases selected from the group consisting of He, Ne, Ar and Xe. Further, it is desirable for the process gas to further contain $O_2$.

In the plasma processing method according to the first aspect of the present invention, it is desirable for the plasma processing to be carried out for forming an $\alpha$-CF film on the target object. In this case, it is desirable for the fluorocarbon compound to consist of 1,1,1,4,4,4-hexafluoro-2-butyne or 1,1,1,4,4,5,5,5-octafluoro-2-pentyne.

According to a second aspect of the present invention, there is provided a control program that, when executed, causes a computer to control a plasma processing apparatus using a plasma processing method, said method comprising:

processing a target object by using a plasma generated by a process gas containing a fluorocarbon compound, wherein said fluorocarbon compound has at least one triple bond within the molecule and at least one $CF_3$ group bonded by a single bond to the carbon atom forming the triple bond with the adjacent carbon atom.

According to a third aspect of the present invention, there is provided a computer readable storage medium containing a software that, when executed, causes a computer to control a plasma processing apparatus using a plasma processing method, said method comprising:

processing a target object by using a plasma generated by a process gas containing a fluorocarbon compound, wherein said fluorocarbon compound has at least one triple bond within the molecule and at least one $CF_3$ group bonded by a single bond to the carbon atom forming the triple bond with the adjacent carbon atom.

According to the plasma processing method of the present invention, it is possible to carry out the selective etching of a silicon oxide film with a high etching selectivity ratio relative to the photoresist film used as an etching mask, or to form a CF film at a high deposition rate by using a gas of a fluorocarbon compound having a triple bond and at least one $CF_3$ group bonded by a single bond to the carbon atom forming the triple bond with the adjacent carbon atom.

It is possible to etch a silicon oxide film such as a $SiO_2$ film with a high etching selectivity ratio relative to the photoresist film by using 1,1,1,4,4,4-hexafluoro-2-butyne in place of the conventional fluorocarbon compounds such as c-$C_5F_8$ and 1,3-$C_4F_6$. Further, in the case of the etching treatment using 1,1,1,4,4,4-hexafluoro-2-butyne, it is possible to obtain a high etching selectivity ratio of the silicon oxide film relative to the photoresist film, i.e., the etching selectivity ratio of about 4.8 to 6, while preventing the etch stop by setting the residence time of the etching gas at 0.01 to 0.1 second. It follows that the plasma processing method of the present invention can be suitably utilized in the etching process for forming a hole or a trench in an oxide film such as a $SiO_2$ film or a SiOF film in the process of forming, for example, a gate electrode included in the semiconductor device.

Also, it is possible to form efficiently a CF film with a high deposition rate by using 1,1,1,4,4,4-hexafluoro-2-butyne or 1,1,1,4,4,5,5,5-octafluoro-2-pentyne as the fluorocarbon compound. It follows that the plasma processing method of the present invention can be suitably utilized as a CVD film-forming process for depositing a CF film used as a low-k film on a silicon substrate or on an interlayer dielectric film formed of, for example, $SiO_2$ in the step of forming, for example, a gate electrode included in a semiconductor device.

DETAILED DESCRIPTION OF THE INVENTION

In the plasma processing method of the present invention, a gas containing a fluorocarbon compound is used as a process gas. The fluorocarbon compound contained in the process gas has at least one triple bond within the molecule and at least one $CF_3$ group bonded by a single bond to the carbon atom forming the triple bond with the adjacent carbon atom. For example, the fluorocarbon compound used in the present invention is represented by general formula (I) given below:

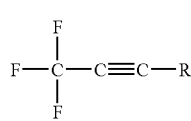

(I)

where R denotes an organic residue group such as $CF_3$ or $C_2F_5$ or an inorganic residue group.

Among the compounds represented by general formula (I), it is particularly desirable to use the compound represented by general formula (I) in which the substituent R denotes $C_2F_5$, i.e., 1,1,1,4,4,5,5,5-octafluoro-2-pentyne, which is also denoted by 2-$C_5F_8$, and the compound represented by general formula (I) in which the substituent R denotes $CF_3$, i.e., 1,1,1,4,4,4-hexafluoro-2-butyne, which is also denoted by 2-$C_4F_6$.

As apparent from general formula (I) given above, the fluorocarbon compound used in the present invention has at least one triple bond in the molecule and at least one $CF_3$ group bonded by a single bond to the carbon atom forming the triple bond with the adjacent carbon atom. It should be noted that the triple bond tends to be broken easily within plasma so as to cause the $CF_3$ group positioned adjacent to the broken portion to be rendered free. The free $CF_3$ group is highly unstable and tends to be polymerized easily. Therefore, in the etching process, the formed polymer is deposited on the surface of the photoresist film so as to perform the function of a resist protective film. Also, in the film-forming process, the formed polymer is deposited at a high deposition rate on the target object on which a film is to be formed such as a silicon substrate or a silicon oxide film so as to form a CF film.

In the case of applying the plasma processing method of the present invention to the etching process, the target object to be etched includes, for example, a silicon oxide film such as a $SiO_2$ film or a SiOF film as well as a SiOC film and a SiOCH film.

In the case of applying the plasma processing method of the present invention to the CVD film-forming process, the target object to which is applied the plasma processing method of the present invention includes, for example, a silicon substrate, a polycrystalline silicon (polysilicon) layer forming a gate electrode, a silicon oxide film forming an interlayer dielectric film or a gate insulating film, such as a $SiO_2$ film or a SiOF film.

A preferred embodiment of the present invention will now be described with reference to the accompanying drawings.

Figure 1A:
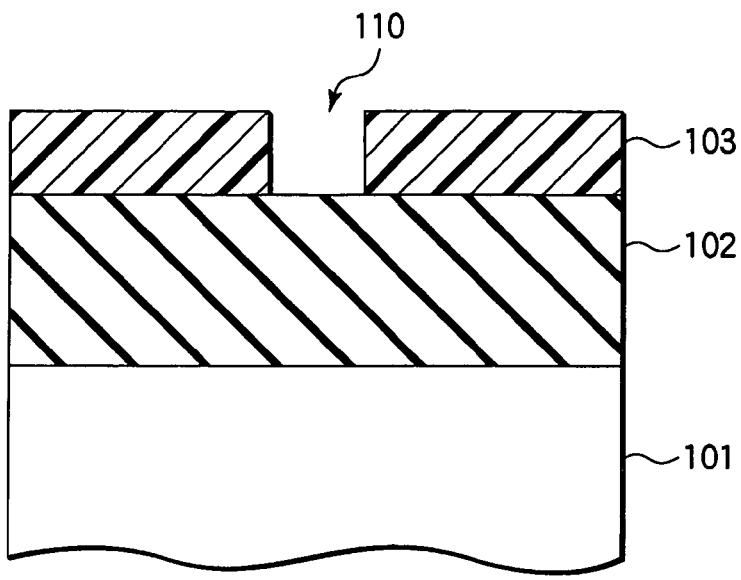
FIGS. 1A and 1B are cross sectional views schematically showing the construction of a wafer used for the description of the first embodiment of the present invention.
Figure 1B:
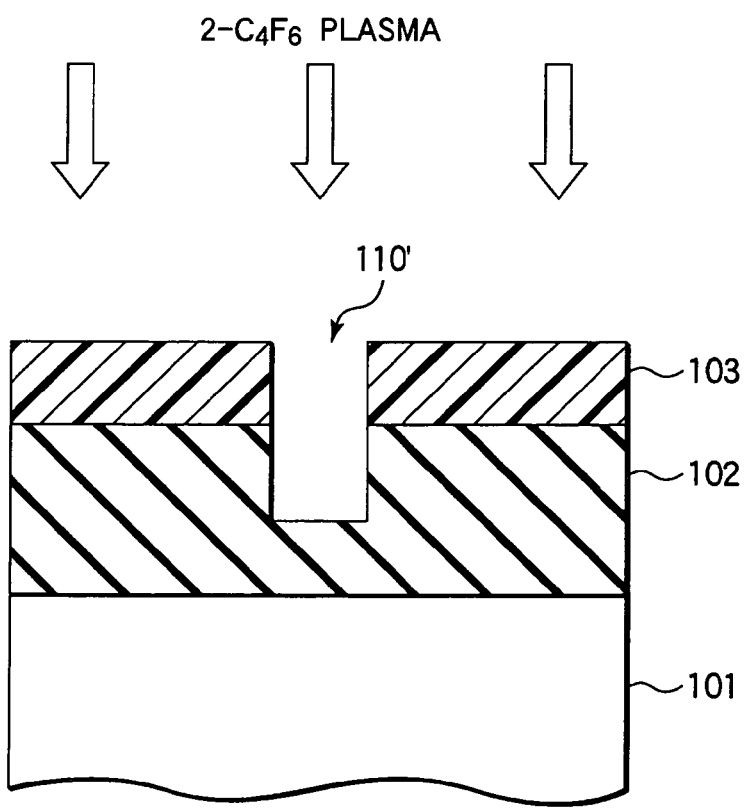

FIGS. 1A and 1B are cross sectional views schematically showing in a magnified fashion a gist portion of a semiconductor wafer (hereinafter simply called wafer) W and used for describing an example of the etching process according to one embodiment of the present invention. As shown in FIG. 1A, a silicon oxide film 102 such as a $SiO_2$ film is formed as an insulating film on a silicon substrate 101 constituting the wafer W, and a photoresist film 103 used as an etching mask is formed on the silicon oxide film 102. The photoresist film 103 is formed of, for example, polyhydroxy styrene for the Kr—F resist or polymethylmethacrylate (PMMA) for the Ar—F resist and is patterned in a prescribed shape. As shown in the drawing, the silicon oxide film 102 is exposed to the bottom of the open portion 110 forming a pattern, which corresponds to a trench or a hole.

Figure 2:
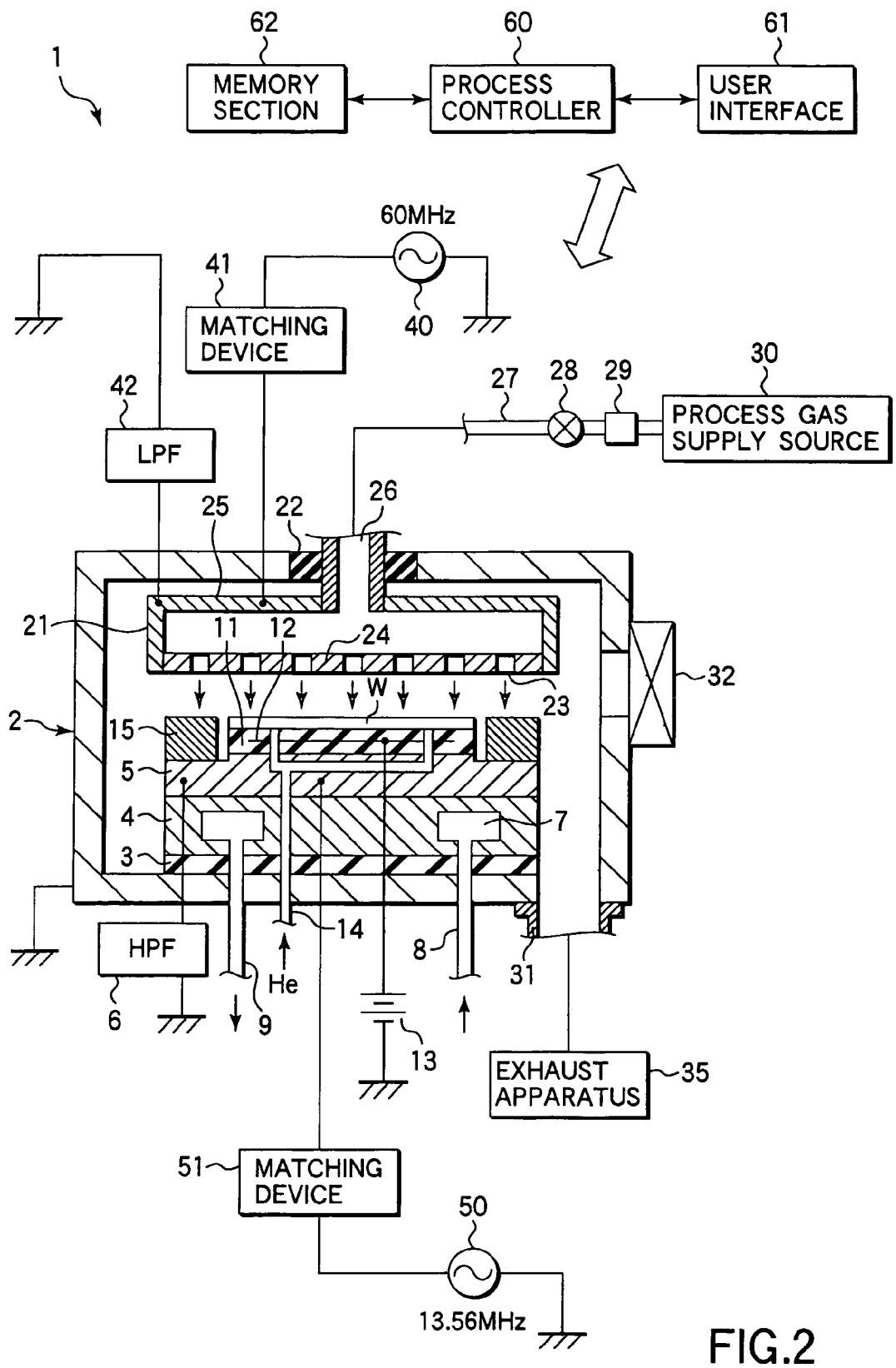
FIG. 2 schematically shows the gist portion of the plasma processing apparatus used in the present invention.

As shown in FIG. 1B, the etching is performed by using a plasma processing apparatus 1 shown in FIG. 2 in order to remove selectively the silicon oxide film 102 positioned within the open portion 110 of the photoresist film 103. It is desirable for the etching gas used for selectively removing the silicon oxide film 102 to be formed of a mixed gas containing a fluorocarbon compound gas such as a 2-$C_4F_6$ gas and a rare gas such as He, Ne, Ar or Xe. It is more desirable for the etching gas to further contain $O_2$. To be more specific, the plasma etching is performed by using a gas containing, for example, 2-$C_4F_6$, Ar and $O_2$. It is possible for the etching to be finished at the time when, for example, the depth of the open portion 110 (trench or a hole) has reached a prescribed level. It is desirable for the etching to be performed under the conditions that permit selectively etching the silicon oxide film 102 at an etching rate of at least 450 nm/min. It is also desirable for the etching selectivity ratio of the silicon oxide film 102 to the photoresist film 103, i.e., the ratio of the etching rate of the silicon oxide film 102 to the etching rate of the photoresist film 103, to fall within a range of 4.8 to 6.

FIG. 2 schematically shows the construction of a plasma processing apparatus 1 that is suitably used for the etching process according to the first embodiment of the present invention. The plasma processing apparatus 1 can be utilized as a capacitively coupled type parallel plate etching apparatus in which an upper electrode plate and a lower electrode plate are arranged in parallel in a manner to face each other and a high frequency power source is connected to each of the upper and the lower electrode plates.

The plasma processing apparatus 1 comprises a cylindrical chamber 2 formed of, for example, an aluminum having the surface subjected to an anodizing treatment (anodic oxidation treatment) and connected to the ground. A susceptor 5 performing the function of a lower electrode and supported by a susceptor table 4 is arranged within the chamber 2. A wafer W formed of, for example, silicon and having a prescribed film formed thereon is horizontally supported by the susceptor 5 so as to be subjected to an etching treatment within the plasma processing apparatus 1. A high pass filter (HPF) 6 is connected to the susceptor 5.

A temperature control medium chamber 7 is formed within the susceptor table 4. A temperature control medium is introduced into the temperature control medium chamber 7 through an introducing pipe 8 so as to be circulated within the susceptor table 4, thereby controlling the susceptor 5 at a prescribed temperature.

The central portion on the upper surface of the susceptor 5 is formed like a convex circular plate, and an electrostatic chuck 11 substantially equal in shape to the wafer W is arranged on upper surface of the susceptor 5 shaped like the convex circular plate. The electrostatic chuck 11 is constructed such that an electrode 12 is formed within an insulating material. A DC voltage of, for example, 1.5 kV is applied from a DC power supply 13 connected to the electrode 12 so as to permit the wafer W to be electrostatically sucked by the electrostatic chuck 11 by the Coulomb force.

A gas passageway 14 is formed in a manner to extend through an insulating plate 3, the susceptor table 4, the susceptor 5 and the electrostatic chuck 11 for supplying a heat transmitting medium such as a He gas under a prescribed pressure (back pressure) to the back surface of the wafer W to be processed. The heat transmission between the susceptor 5 and the wafer W is performed through the heat transmitting medium so as to maintain the wafer W at a prescribed temperature.

An annular focus ring 15 is arranged on the upper peripheral portion of the susceptor 5 in a manner to surround the wafer W disposed on the electrostatic chuck 11. The focus ring 15 is made of an insulating material such as a ceramic material or quartz and serves to improve the uniformity of the etching.

An upper electrode 21 is arranged above the susceptor 5 so as to be positioned in parallel to and in a manner to face the susceptor 5. The upper electrode 21, which is supported in an upper portion of the chamber 2 via an insulating material 22 in a manner to face the susceptor 5, comprises an electrode plate 24 and an electrode support member 25 supporting the electrode plate 24. The electrode plate 24 is provided with a large number of spurting ports 23 and made of, for example, quartz. On the other hand, the electrode support member 25 is made of a conductive material such as an aluminum having the surface subjected to, for example, an anodizing treatment.

Incidentally, it is possible to control the clearance between the susceptor 5 and the upper electrode 21.

A gas introducing port 26 is formed in the center of the electrode support member 25 included in the upper electrode 21. A gas supply pipe 27 is connected to the gas introducing port 26. Further, a process gas supply source 30 is connected to the gas supply pipe 27 via a valve 28 and a mass flow controller 29. Because of the particular construction, an etching gas used for the plasma etching is supplied from the process gas supply source 30 into the chamber 2. Incidentally, FIG. 2 shows a single process gas supply source 30 alone as a representative. However, a plurality of process gas supply sources 30 are included in the plasma processing apparatus 1 such that the flow rates of a fluorocarbon compound gas such as a 2-$C_4F_6$ gas, a rare gas such as an Ar gas and an $O_2$ gas can be controlled independently when the process gas containing the fluorocarbon compound gas, the rare gas and the $O_2$ gas are supplied into the chamber 2.

An exhaust pipe 31 is connected to the bottom portion of the chamber 2, and an exhaust apparatus 35 is connected to the exhaust pipe 31. The exhaust apparatus 35 is equipped with a vacuum pump such as a turbo molecular pump so as to evacuate the inner region of the chamber 2, thereby setting up a prescribed reduced pressure atmosphere within the chamber 2. For example, the inner region of the chamber 2 is evacuated to a prescribed pressure not higher than 1 Pa. A gate valve 32 is formed in the side wall of the chamber 2. The wafer W is transferred between the chamber 2 and an adjacent load lock chamber (not shown) under the state that the gate valve 32 is opened.

A first high frequency power supply 40 is connected to the upper electrode 21, and a matching device 41 is mounted to the power supply line connected at one end to the upper electrode 21 and at the other end to the first high frequency power supply 40. Also, a low pass filter (LPF) 42 is connected to the upper electrode 21. The first high frequency power supply 40 has frequencies falling within a range of 50 to 150 MHz. By applying the high frequency power having such a high frequency, it is possible to form a plasma of a high density within the chamber 2 under a desired dissociated state so as to make it possible to perform a plasma processing under a low pressure condition. Further, it is desirable for the frequency of the first high frequency power supply 40 to fall within a range of 50 to 80 MHz. Typically, a frequency of 60 MHz or the conditions in the vicinity thereof is employed as shown in FIG. 2.

A second high frequency power supply 50 is connected to the susceptor 5 acting as the lower electrode and a matching device 51 is connected to the power supply line leading from the second high frequency power supply 50 to the susceptor 5. The second high frequency power supply 50 has a frequency falling within a range of hundreds of kHz to scores of MHz. By applying a high frequency power having the frequency falling within the range noted above, it is possible to impart an appropriate ionic function to the wafer W without doing damage to the wafer W. A frequency of, for example, 13.56 MHz or the conditions of 800 kHz is employed as the frequency of the second high frequency power supply 50 as shown in FIG. 2.

Each constituting section of the plasma processing apparatus 1 is connected to a process controller 60 equipped with CPU so as to be controlled by the process controller 60. A user interface 61 is connected to the process controller 60. The user interface 61 comprises a keyboard operated by the process supervisor for performing the input operation of commands required for supervising the plasma processing apparatus 1 and a display device for visually displaying the operating state of the plasma processing apparatus 1.

A memory section 62 is also connected to the process controller 60. Stored in the memory section 62 are a control program (soft ware) for realizing the various processing executed by the plasma processing apparatus 1 under the control by the process controller 60 and a recipe recording, for example, the process condition data.

A desired processing is carried out in the plasma processing apparatus 1 under the control by the process controller 60 by reading, as required, an optional recipe from the memory section 62 upon receipt of the instruction from the user interface 61 so as to have the recipe read from the memory section 62 executed by the process controller 60. It is also possible to utilize the recipe recording, for example, the control program and the process condition data, said recipe being stored in a memory medium that can be read by a computer such as a CD-ROM, a hard disc, a flexible disc or a nonvolatile memory. Alternatively, it is also possible for the recipe to be transferred as required via an exclusive circuit so as to be utilized on the on-line basis.

The etching process will now be described in respect of the etching of the silicon oxide film 102 formed on the silicon substrate 101, which is performed by the plasma processing apparatus 1 of the construction described above.

In the first step, the wafer W having the silicon oxide film 102 and the patterned photoresist film 103 formed thereon is transferred from the load lock chamber (not shown) into the chamber 2 by opening the gate valve 32. The wafer W thus introduced into the chamber 2 is disposed on the electrostatic chuck 11. Then, a DC voltage is applied from the DC power supply 13 to the electrostatic chuck 11 so as to permit the wafer W to be electrostatically sucked on the electrostatic chuck 11.

In the next step, the gate valve 32 is closed, and the inner region of the chamber 2 is evacuated by the exhaust apparatus 35 to a prescribed degree of vacuum. Then, the valve 28 is opened so as to permit the etching gas including a gas of fluorocarbon compound $C_xF_y$, where x and y denote optional integers, such as 2-$C_4F_6$ gas, an Ar gas and an $O_2$ gas to be introduced from the process gas supply source 30 into the hollow portion of the upper electrode 21 via the mass flow controller 29, the process gas supply pipe 27, and the gas introducing port 26. The fluorocarbon gas, the Ar gas and the $O_2$ gas are controlled at a prescribed flow rate ratio by the mass flow controller 29. Then, the etching gas is spurted uniformly through the spurting holes 23 of the electrode plate 24 onto the wafer W, as denoted by arrows in FIG. 2. It is desirable for the process gas flow rate to be controlled such that the flow rate of the 2-$C_4F_6$ gas is set at 10 to 50 mL/min, the flow rate of the Ar gas is set at 0 to 1,500 mL/min, and the flow rate of the $O_2$ gas is set at 10 to 50 mL/min. More desirably, the flow rates of the 2-$C_4F_6$/Ar/$O_2$ should be about 18~20/300/20 mL/min.

It is desirable for the etching to be performed at an etching rate not lower than 450 nm/min. Further, in order to increase the etching selectivity ratio of the silicon oxide film 102 relative to the photoresist film 103 in the etching stage, it is desirable for the residence time of the process gas to fall within a range of about 0.01 to 0.1 second, desirably 0.01 to 0.03 second. The residence time is the average length of time for which the etching gas contributes to etching in the chamber 2 and is expressed by:

$$\tau = V/S = pV/Q$$

where $\tau$ (sec) is residence time, V (m$^3$) is effective chamber volume obtained by multiplying the area of the wafer W and the focus ring 15 by interelectrode distance, i.e., the volume of a space where the etching gas changes into a plasma, S (m$^3$/sec) is discharge rate, p (Pa) is the pressure in the chamber 2, and Q (Pa·m$^3$/sec) is total flow rate.

The pressure inside the chamber 2 is maintained at a prescribed pressure, e.g., 1 to 8 Pa, desirably about 2.0 Pa. Under this condition, a high frequency power of 500 to 3,000 W, desirably about 2,200 W, is supplied from the first high frequency power supply 40 to the upper electrode 21, and a high frequency power of 1,000 to 3,000 W, desirably about 1,800 W, is supplied from the second high frequency power supply 50 to the susceptor 5 acting as the lower electrode so as to convert the etching gas into a plasma, thereby etching selectively the silicon oxide film 102. Incidentally, it is desirable for the back pressure to be set at about 666.5 Pa and about 3332.5 Pa in the central portion and the edge portion, respectively, of the wafer W. Also, concerning the process temperature, it is desirable for the temperature of the upper electrode 21 to be set at 60° C., for the temperature of side wall of the chamber 2 to be set at 50° C. and for the temperature of the susceptor 5 to be set at −10° C.

Figure 3A:
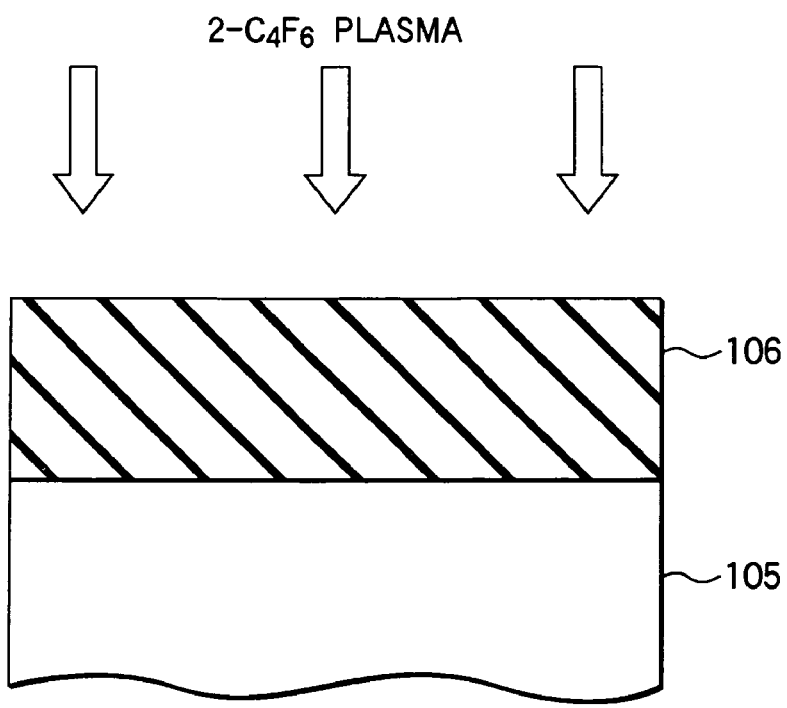
FIGS. 3A and 3B are cross sectional views schematically showing the construction of a wafer used for the description of the second embodiment of the present invention.
Figure 3B:
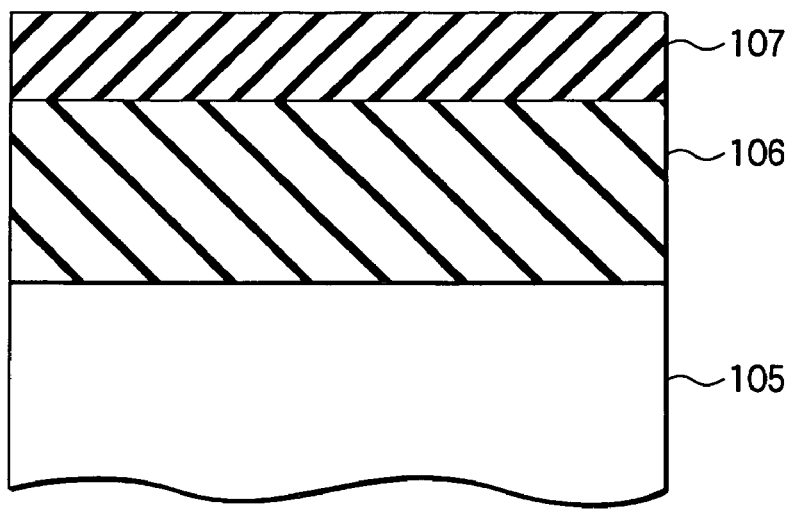

FIGS. 3A and 3B schematically exemplify the CVD film-forming process according to a second embodiment of the present invention. As shown in FIG. 3A, a polysilicon layer 105 constituting, for example, the gate electrode and a silicon oxide film 106 used as an interlayer insulating film are formed on the wafer W.

As shown in FIGS. 3A and 3B, the CVD film formation is intended to form a CF film 107 acting as a low-k film on the silicon oxide film 106 by using the plasma processing apparatus 1 constructed as shown in FIG. 2. In forming the CF film 107, it is desirable to use as a film-forming gas a mixed gas containing a fluorocarbon compound gas and a rare gas such as He, Ne, Ar, Kr or Xe. It is more desirable for the film-forming gas to further contain $O_2$. The plasma CVD is performed by using, for example, a mixed gas containing 2-$C_4F_6$ and/or 2-$C_5F_8$, Ar and $O_2$. The CVD can be finished at the time when, for example, the CF film 107 has grown to reach a prescribed thickness.

In the CVD film-forming process according to the second embodiment of the present invention, the plasma processing apparatus 1 shown in FIG. 2 can be suitably utilized as the CVD apparatus as in the first embodiment described above. Therefore, the following description covers mainly the differences between the first embodiment and the second embodiment.

Where the plasma processing apparatus 1 is utilized as the plasma etching apparatus, a high frequency power is supplied from the second high frequency power supply 50 to the susceptor 5 used as the lower electrode. Where the plasma processing apparatus 1 is utilized as a CVD apparatus, however, a prescribed high frequency power is supplied to the upper electrode 21 alone, and the plasma processing is performed without supplying a high frequency power to the susceptor 5.

In the CVD film-forming process, the gate valve 32 is opened so as to transfer the wafer W having the polysilicon film 105 and the silicon oxide film 106 formed thereon from the load lock chamber (not shown) into the chamber 2 and, then, to dispose the wafer W on the electrostatic chuck 11. Under this condition, a DC voltage is applied from the DC power supply 13 to the electrostatic chuck 11 so as to permit the electrostatic chuck 11 to suck electrostatically the wafer W.

In the next step, the gate valve 32 is closed, and the inner space of the chamber 2 is evacuated by the exhaust apparatus 35 to a prescribed degree of vacuum. Then, the valve 28 is opened so as to introduce the film-forming gas including a fluorocarbon compound ($C_xF_y$) such as 2-$C_4F_6$ or 2-$C_5F_8$, Ar and $O_2$ into the hollow portion of the upper electrode 21 via the process gas supply pipe 27 and the gas introducing port 26. In this case, the flow of the fluorocarbon compound gas, the Ar gas and the $O_2$ is controlled by the mass flow controller 29 at a prescribed flow rate ratio. Then, the film-forming gas is spurted uniformly through the spurting ports 23 of the electrode plate 24 onto the wafer W as denoted by arrows in FIG. 2. It is desirable for the process gas flow rate to be controlled such that the flow rate of the $C_xF_y$ gas is set at 10 to 50 mL/min, the flow rate of the Ar gas is set at 0 to 1,500 mL/min, and the flow rate of the $O_2$ gas is set at 10 to 50 mL/min. More desirably, the flow rates of the $C_xF_y$/Ar/$O_2$ should be about 40/300/20 mL/min. Also, it is desirable for the residence time of the process gas to fall within a range of about 0.01 to 0.1 second, more desirably 0.01 to 0.03 second. The residence time is the average length of time for which the film-forming gas contributes to deposition in the chamber 2 and is expressed by:

$$\tau = V/S = pV/Q$$

where $\tau$ (sec) is residence time, V($m^3$) is effective chamber volume obtained by multiplying the area of the wafer W and the focus ring 15 by interelectrode distance, i.e., the volume of a space where the film-forming gas changes into a plasma, S ($m^3$/sec) is discharge rate, p (Pa) is the pressure in the chamber 2, and Q (Pa·$m^3$/sec) is total flow rate.

The inner pressure of the chamber 2 is maintained at a prescribed value, e.g., 1 to 8 Pa, desirably about 2.0 Pa. Under this condition, a high frequency power of 500 to 3,000 W, preferably about 2,200 W is supplied from the first high frequency power supply 40 to the upper electrode 21, and a high frequency power of 0 to 1,000 W, preferably 0 W, is supplied from the second high frequency power supply 50 to the susceptor 5 acting as the lower electrode so as to convert the process gas into a plasma, thereby forming the CF film 107 on the silicon oxide film 106. Concerning the process temperature, it is desirable for the temperature of the upper electrode 21 to be set at 60° C., for the temperature of the side wall of the chamber 2 to be set at 50° C. and for the temperature of the susceptor 5 to be set at 20° C.

An experiment conducted for confirming the effect of the present invention will now be described. The fluorocarbon compounds ($C_xF_y$) used in this experiment had the structural formulas given below:

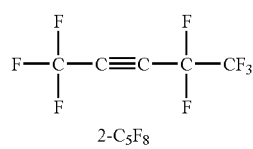

2-$C_5F_8$ (a)

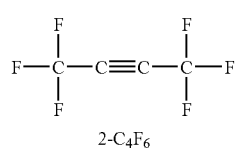

2-$C_4F_6$ (b)

-continued

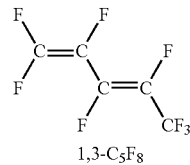

1,3-$C_5F_8$ (c)

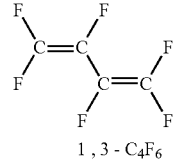

1,3-$C_4F_6$ (d)

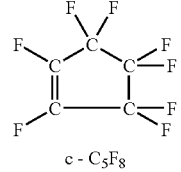

c-$C_5F_8$ (e)

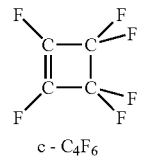

c-$C_4F_6$ (f)

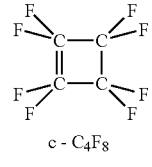

c-$C_4F_8$ (g)

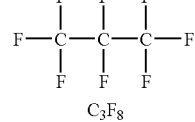

$C_3F_8$ (h)

A sample wafer constructed as shown in FIG. 1A was prepared by forming a $SiO_2$ film as the silicon oxide film 102 in a thickness of 2,000 nm by the thermal oxidation on the silicon substrate 101, followed by forming the photoresist film 103 in a thickness of 660 nm on the silicon oxide film 102. The photoresist film 103 included the open portion 110 having a diameter corresponding to the hole. Incidentally, an X-ray mask photoresist formed of polymethylmethacrylate (PMMA) was used as the photoresist film 103.

The sample wafer was selectively etched by using the plasma processing apparatus 1 of the construction equal to that shown in FIG. 2, except that the chamber 2 had an inner volume of 70 L, so as to form holes each having a diameter of 0.1 μm, 0.15 μm or 0.3 μm in the silicon oxide film 102. The etching rate was measured in the case of forming each of these holes so as to calculate the etching selectivity ratio of the silicon oxide film relative to the photoresist film. Incidentally, the etching selectivity ratio of the silicon oxide film relative to the photoresist film was calculated for each of the flat portion and the facet portion separately. Incidentally, the flat portion noted above denotes the result of the etching rate measurement performed on the basis of the thickness of the flat portion of the photoresist film 103 (i.e., the entire thickness of the photoresist film 103). On the other hand, the facet portion noted above denotes the result of the etching rate calculation performed on the basis of the film thickness obtained by subtracting the thickness of the scraped shoulder portion from the entire thickness of the photoresist film 103 in the case where the corner portion of the photoresist film 103 was scraped by the function of the ion sputtering.

Used as the fluorocarbon compound contained in the etching gas was $2\text{-}C_4F_6$, which has at least one triple bond in the molecule and at least one $CF_3$ group bonded by a single bond to the carbon atom forming the triple bond with the adjacent carbon atom. Also used for comparison was $1,3\text{-}C_4F_6$, which is a constitutional isomer of the fluorocarbon compound noted above.

The flow rates of Ar and $O_2$ were fixed and the flow rate of $C_4F_6$ was changed so as to set the flow rates of $C_4F_6/Ar/O_2$ at 18~24/300/20 mL/min (sccm). Also, the inner pressure of the chamber 2 was set at about 2.0 Pa (15 mTorr). Under this condition, a high frequency power of 2,200 W was supplied to the upper electrode 21 and a high frequency power of 1,800 W was supplied to the susceptor 5 acting as the lower electrode so as to convert the etching gas into a plasma for performing the desired plasma etching. Incidentally, the back pressure was set at about 666.5 Pa (5 Torr) in the central portion of the wafer W and at about 3332.5 Pa (25 Torr) in the edge portion of the wafer W. Concerning the process temperature, the temperature of the upper electrode 21 was set at 60° C., the temperature of the side wall of the chamber 2 was set at 50° C., and the temperature of the susceptor 5 was set at −10° C. Further, the etching time was set at 3 minutes.

Figure 4:
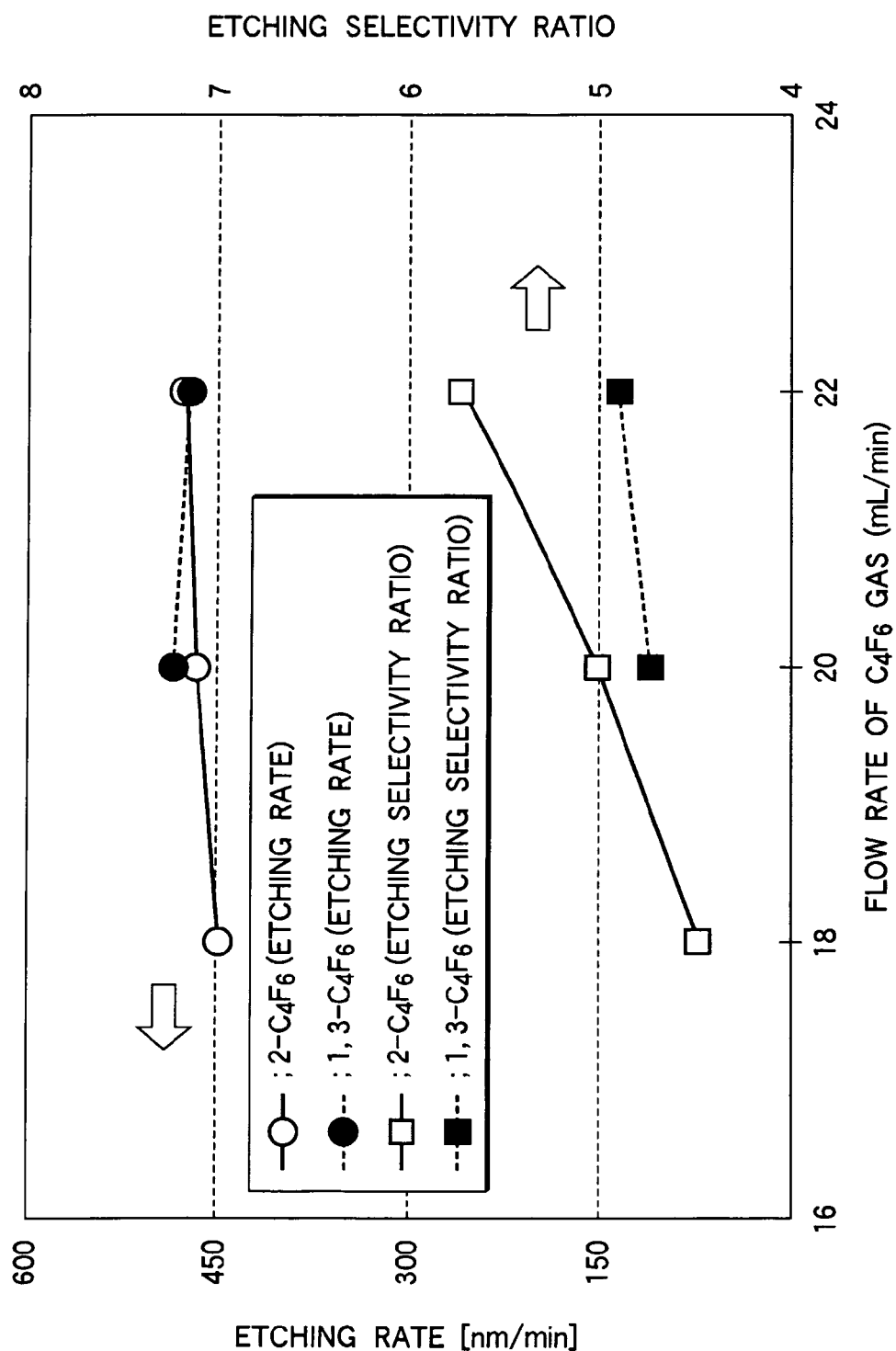
FIG. 4 is a graph showing the relationships between the flow rate of $C_4F_6$ gas and the etching rate and between the flow rate of $C_4F_6$ gas and the etching selectivity ratio of the silicon oxide film relative to the photoresist, covering the case of forming a hole having a diameter of 0.1 μm.
Figure 5:
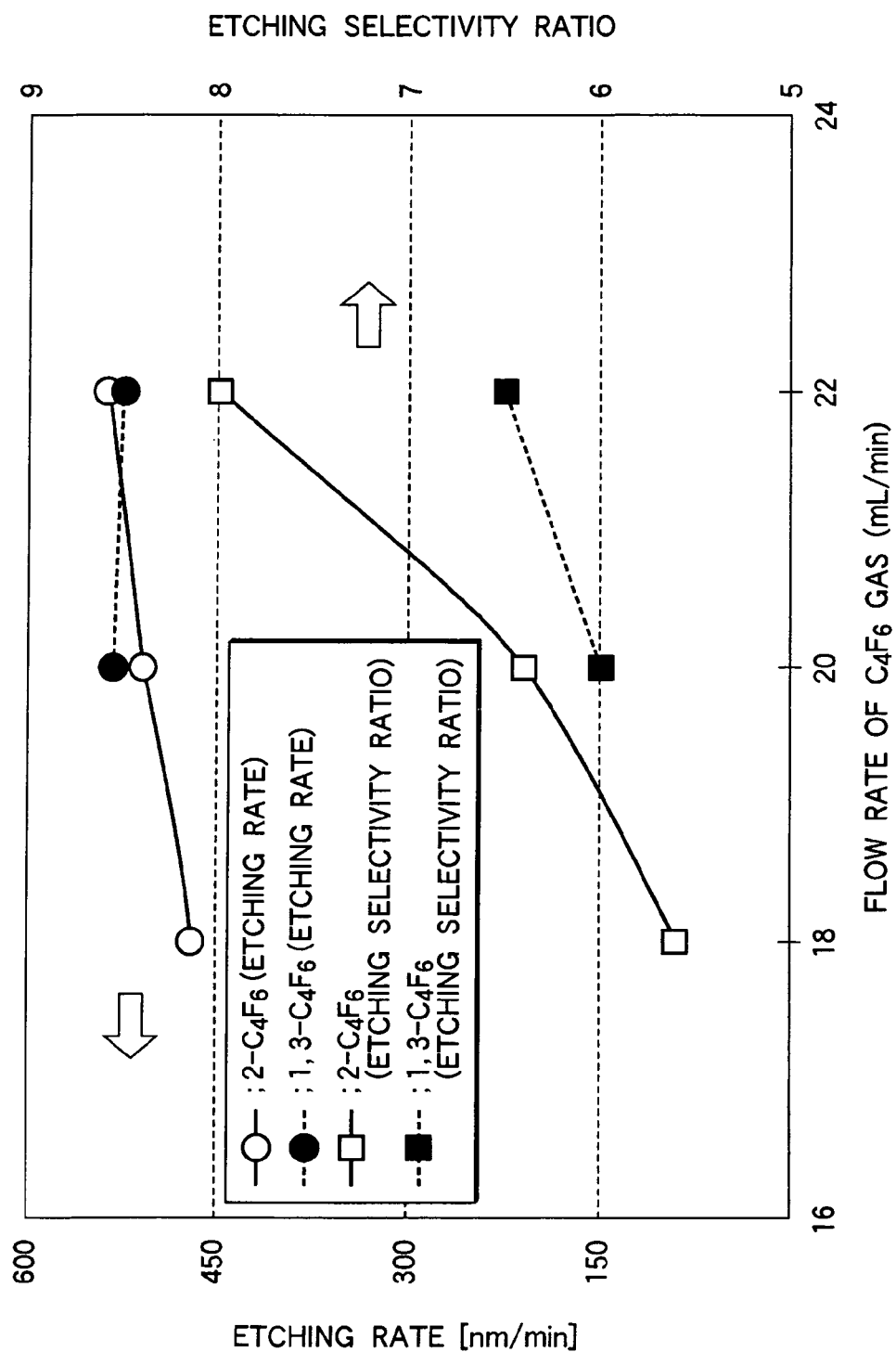
FIG. 5 is a graph showing the relationships between the flow rate of $C_4F_6$ gas and the etching rate and between the flow rate of $C_4F_6$ gas and the etching selectivity ratio of the silicon oxide film relative to the photoresist, covering the case of forming a hole having a diameter of 0.15 μm.
Figure 6:
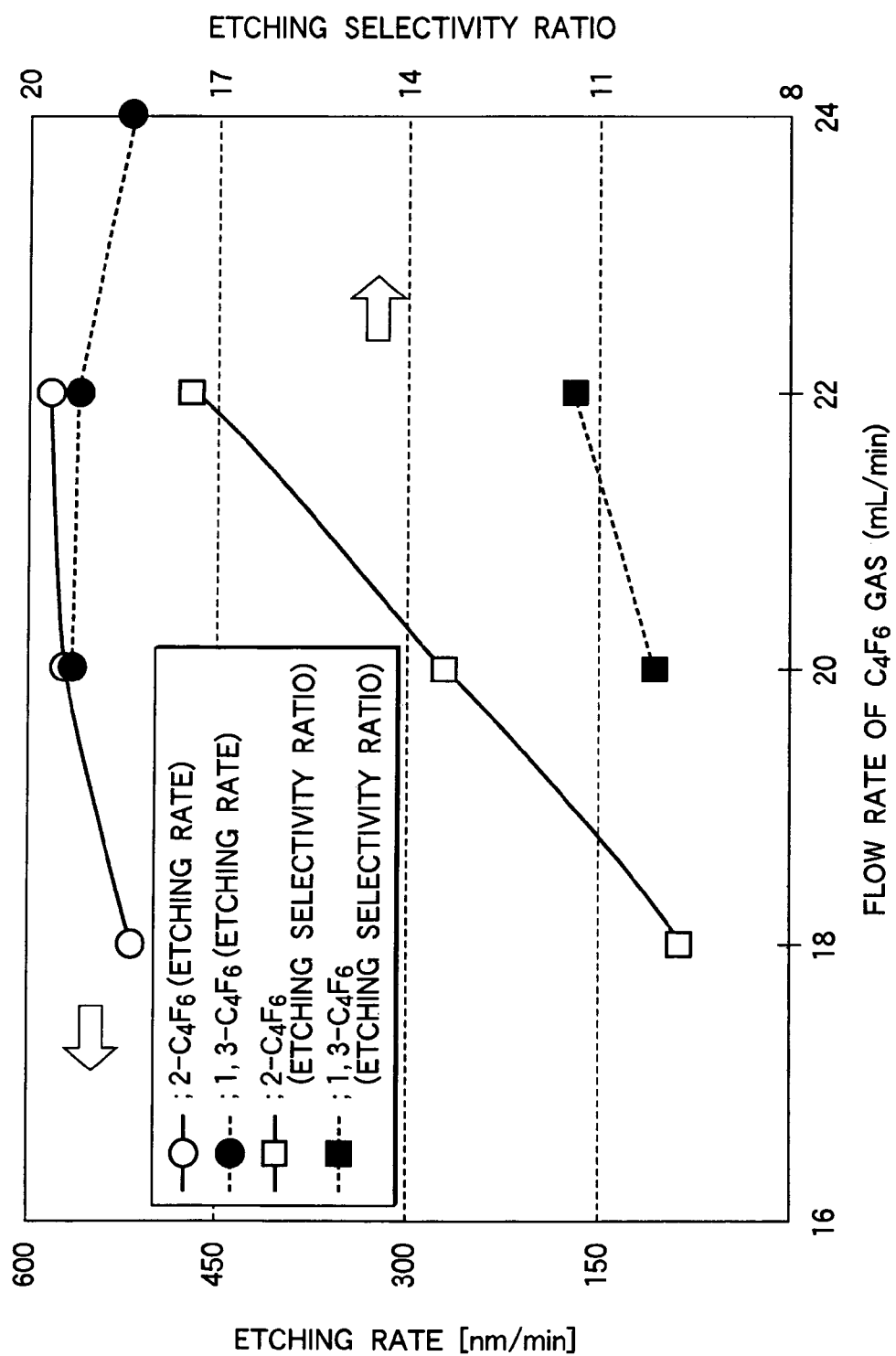
FIG. 6 is a graph showing the relationships between the flow rate of $C_4F_6$ gas and the etching rate and between the flow rate of $C_4F_6$ gas and the etching selectivity ratio of the silicon oxide film relative to the photoresist, covering the case of forming a hole having a diameter of 0.3 μm.

FIG. 4 is a graph showing the etching rate and the etching selectivity ratio of the silicon oxide film relative to the photoresist film, covering the case where the hole formed had a diameter of 0.1 µm, FIG. 5 is a graph showing the etching rate and the etching selectivity ratio of the silicon oxide film relative to the photoresist film, covering the case where the hole formed had a diameter of 0.15 µm, and FIG. 6 is a graph showing the etching rate and the etching selectivity ratio of the silicon oxide film relative to the photoresist film, covering the case where the hole formed had a diameter of 0.3 µm. The experimental data given in FIGS. 4 to 6 cover the result of the measurement in the flat portion.

Figure 7:
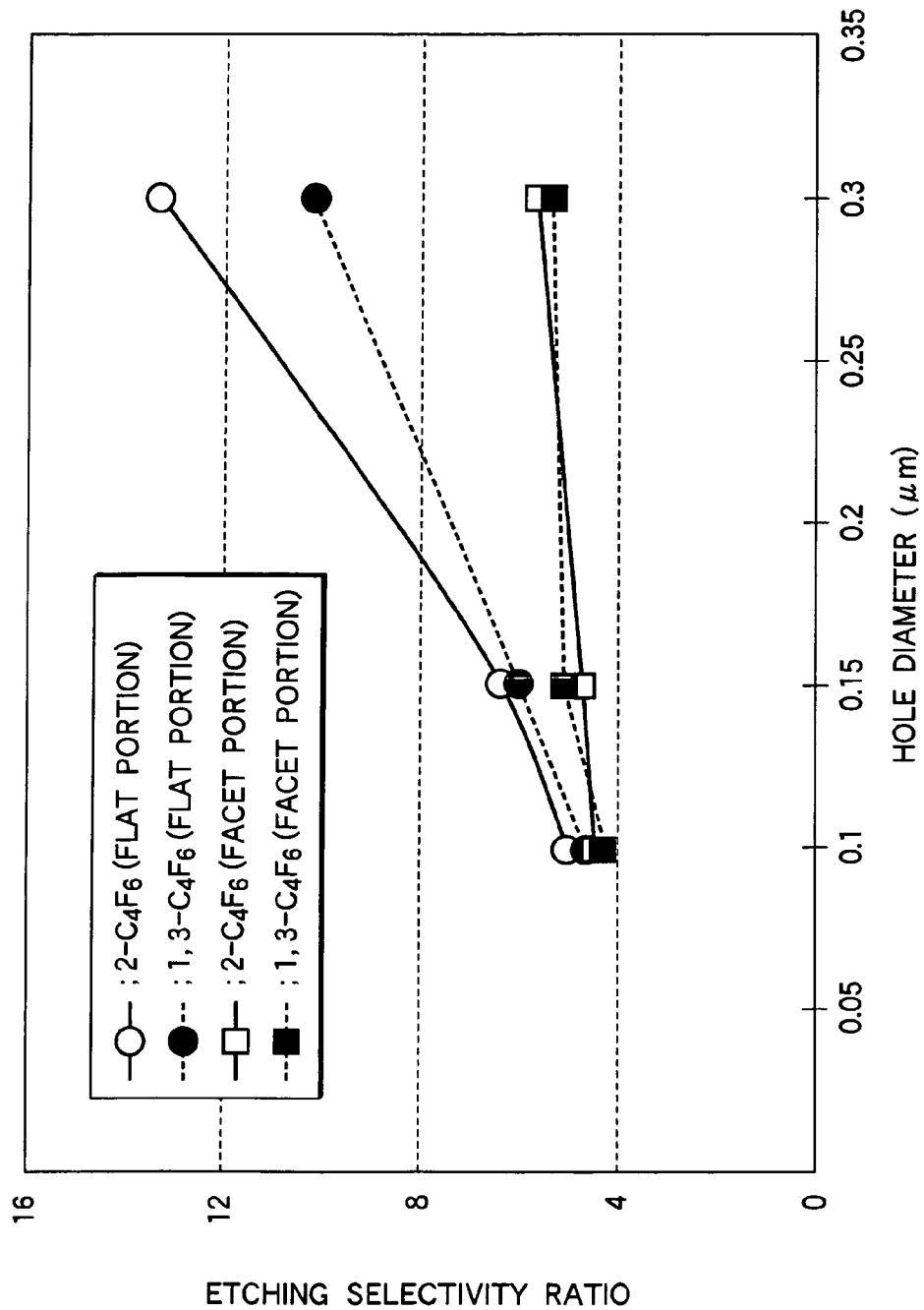
FIG. 7 is a graph showing the relationship between the hole diameter and the etching selectivity ratio of the silicon oxide film relative to the photoresist film, covering the cases of using various kinds of $C_4F_6$ gases.

Also, FIG. 7 is a graph showing the etching selectivity ratio of the silicon oxide film relative to the photoresist film in each of the flat portion and the facet portion, covering each of the hole diameters, in the case where the flow rate of $C_4F_6$ was set at 20 mL/min.

As apparent from FIGS. 4 to 7, the fluorocarbon compound of $2\text{-}C_4F_6$ having at least one triple bond in the molecule and at least one $CF_3$ group bonded by a single bond to the carbon atom forming the triple bond with the adjacent carbon atom was found to be superior to the $1,3\text{-}C_4F_6$, which is an isomer of the fluorocarbon compound noted above, in the etching selectivity ratio of the silicon oxide film relative to the photoresist film. Particularly, in the flat portion, the difference in the etching selectivity ratio of the silicon oxide film relative to the photoresist film between the two fluorocarbon compounds was significantly increased with increase in the hole diameter. Concerning the etching rate, an appreciable difference was not recognized between $2\text{-}C_4F_6$ and $1,3\text{-}C_4F_6$.

The experimental data pointed out above support that $2\text{-}C_4F_6$ makes it possible to carry out an etching treatment with a high etching selectivity ratio of the silicon oxide film relative to the photoresist film while maintaining an etching rate substantially equal to that achieved by $1,3\text{-}C_4F_6$.

Further, a selective etching was applied to the sample wafer by using the plasma etching apparatus 1. In this case, $2\text{-}C_5F_8$, and $2\text{-}C_4F_6$ and constitutional isomers thereof, i.e., $c\text{-}C_5F_8$, $1,3\text{-}C_5F_8$ (octafluoro-1,3-pentadiene) and $1,3\text{-}C_4F_6$, were used as fluorocarbon compounds $(C_xF_y)$ having at least one triple bond in the molecule and at least one $CF_3$ group bonded by a single bond to the carbon atom forming the triple bond with the adjacent carbon atom. A hole having a diameter of 0.15 µm was formed by the selective etching so as to measure the etching rate and the etching selectivity ratio of the silicon oxide film relative to the photoresist film.

The flow rates of Ar and $O_2$ were fixed, and the flow rate of $C_xF_y$ was changed so as to set the flow rates of $C_xF_y/Ar/O_2$ at 14~24/300/20 mL/min (sccm). Also, the inner pressure of the chamber 2 was set at about 2.0 Pa (15 mTorr). Under this condition, a high frequency power of 2,200 W was supplied to the upper electrode 21 and a high frequency power of 1,800 W was supplied to the susceptor 5 acting as the lower electrode so as to convert the etching gas into a plasma for performing the desired plasma etching. Incidentally, the back pressure was set at about 666.5 Pa (5 Torr) in the central portion of the wafer W and at about 3332.5 Pa (25 Torr) in the edge portion of the wafer W. Concerning the process temperature, the temperature of the upper electrode 21 was set at 60° C., the temperature of the side wall of the chamber 2 was set at 50° C., and the temperature of the susceptor 5 was set at −10° C. Further, the etching time was set at 3 minutes.

Figure 8:
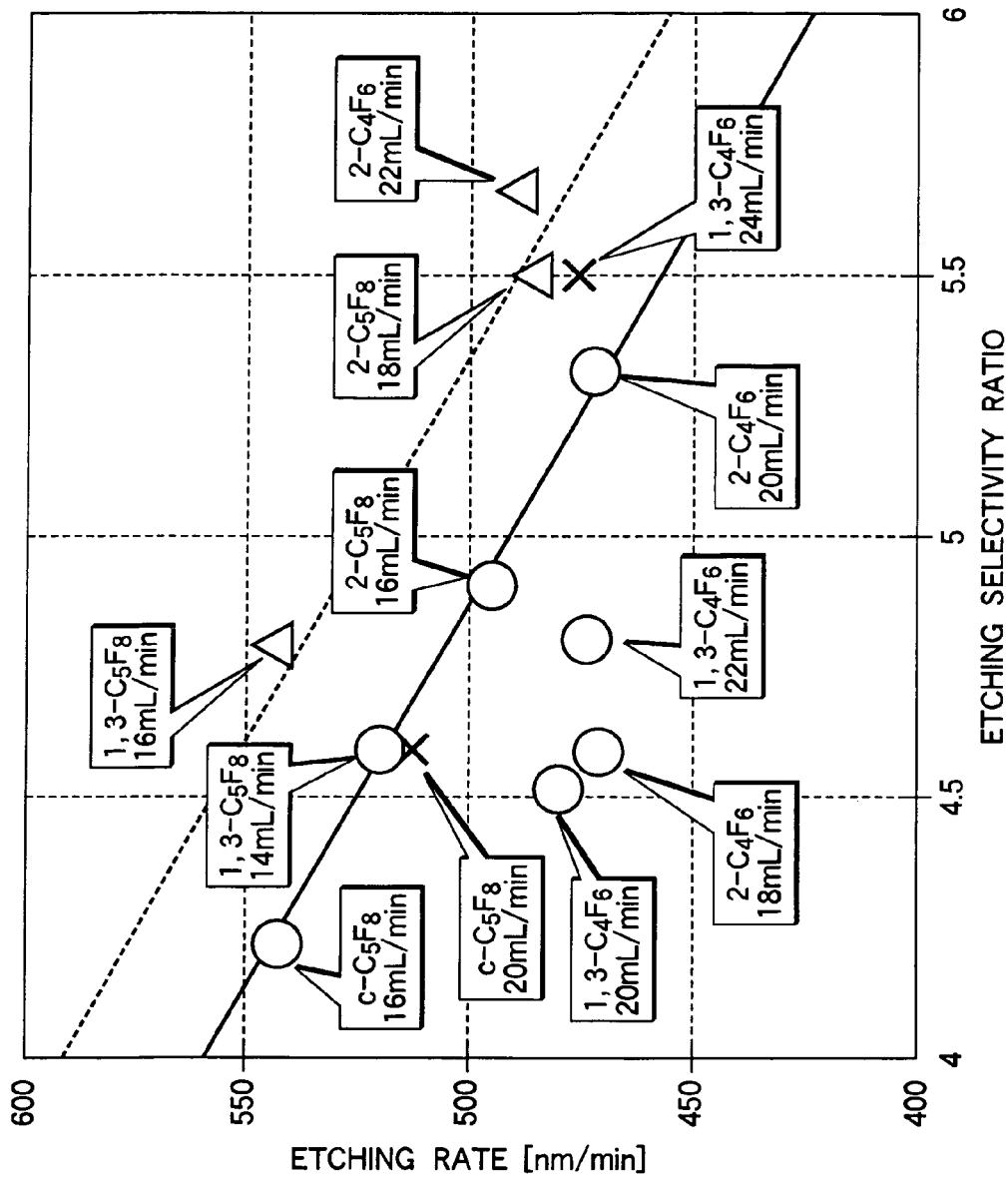
FIG. 8 is a graph showing the relationship between the etching rate and the etching selectivity ratio of the silicon oxide film relative to the photoresist film, covering the use of various kinds of $C_xF_y$ gases.

FIG. 8 is a graph showing the experimental data. The mark ◯ in the graph denotes that the etching performance was satisfactory, the mark Δ denotes that the etching performance was somewhat lowered, and the mark x denotes that the etching was rendered impossible before formation of the hole and, thus, the etching was stopped. The experimental data support that the fluorocarbon compound of $2\text{-}C_4F_6$ having at least one triple bond within the molecule and at least one $CF_3$ group bonded by a single bond to the carbon atom forming the triple bond with the adjacent carbon atom exhibits a high etching selectivity ratio of the silicon oxide film relative to the photoresist film. It is also indicated that, in the case of using the fluorocarbon compound of $2\text{-}C_4F_6$, the etching stop is unlikely to take place even if the flow rate of the particular fluorocarbon compound is increased.

The experimental data given in FIG. 8 also support that, since a high etching selectivity ratio of the silicon oxide film relative to the photoresist film was obtained under the conditions that the chamber 2 had an inner volume of 70 L and that the operating pressure was about 2.0 Pa (15 mTorr) in the case of using the fluorocarbon compound of $2\text{-}C_4F_6$, it is possible to obtain a high etching selectivity ratio of the silicon oxide film relative to the photoresist film if the residence time of the process gas falls within a range of about 0.01 to 0.1 second.

On the other hand, in the case of using the other fluorocarbon compounds, it was certainly possible to obtain a high etching rate as a whole. However, the etching selectivity ratio of the silicon oxide film relative to the photoresist film was low, indicating that it is difficult to use the other fluorocarbon compounds in the case of using a thin photoresist film.

In order to look into the application of the plasma processing apparatus 1 to the CVD film-forming process, a CVD film-forming test was applied to a laminate structure of the construction that a $SiO_2$ film was laminated as the silicon oxide film 106 on the polysilicon layer 105 as in the construction shown in FIG. 3A.

As an example of the film formation by CVD, a CF film acting as a low-k film was formed on the silicon oxide film 106 by using the plasma processing apparatus 1 of the construction equal to that shown in FIG. 2. A gas mixture containing a fluorocarbon compound ($C_xF_y$), Ar and $O_2$ was used as the film-forming gas.

In the CVD film-forming process, the flow rates of Ar and $O_2$ were fixed, and the flow rate of the fluorocarbon compound ($C_xF_y$) was changed such that the gas flow rate ratio of $C_xF_y/Ar/O_2$ was set at 10~50/300/20 mL/min (sccm). The inner pressure of the chamber 2 was set at about 2.0 Pa (15 mTorr), and a high frequency power of 2,200 W was supplied to the upper electrode 21 without supplying a high frequency power to the susceptor 5 used as the lower electrode. Incidentally, the process temperature was set such that the temperature of the upper electrode 21 was set at 60° C., the temperature of the side wall of the chamber 2 was set at 50° C., and the temperature of the susceptor 5 was set at 20° C.

Figure 9:
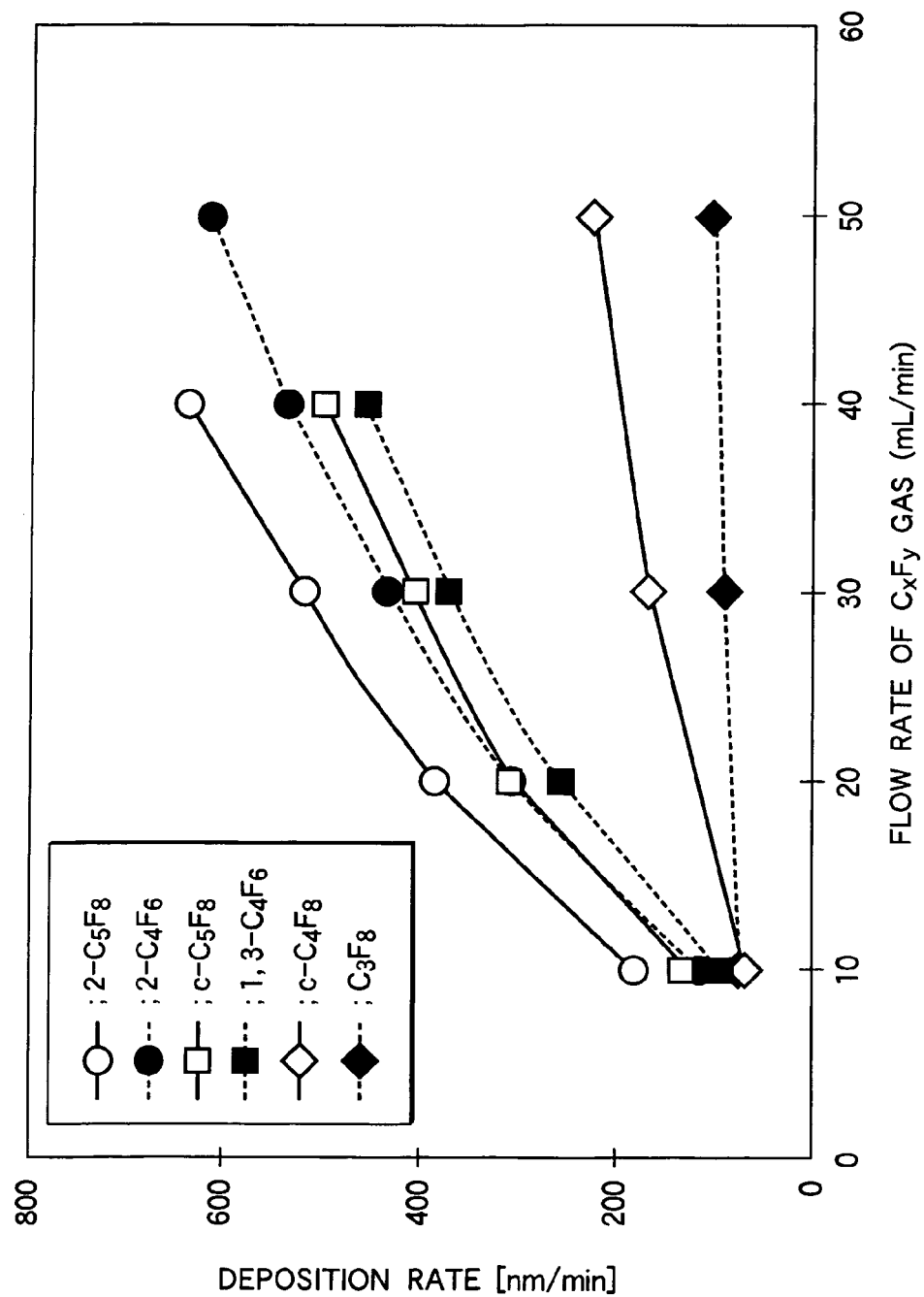
FIG. 9 is a graph showing the relationship between the gas flow rate and the deposition rate, covering the use of various kinds of $C_xF_y$ gases.

FIG. 9 is a graph showing the experimental data.

As apparent from FIG. 9, the highest deposition rate was obtained within the gas flow rate range of 10 to 50 mL/min (sccm) in the case of using 2-$C_5F_8$, which is a fluorocarbon compound having at least one triple bond within the molecule and at least one $CF_3$ group bonded by a single bond to the carbon atom forming the triple bond with the adjacent carbon atom. The second highest deposition rate was obtained in the case of using 2-$C_4F_6$ having a structural formula similar to that of 2-$C_5F_8$. The deposition rates in the case of using the two fluorocarbon compounds referred to above were higher than those in the case of using c-$C_5F_8$ and 1,3-$C_4F_6$, which are constitutional isomers of the fluorocarbon compounds 2-$C_5F_8$ and 2-$C_4F_6$, respectively, referred to above. In the case of using the other fluorocarbon compounds of c-$C_4F_8$ (octafluoro cyclobutane) and $C_3F_8$ (octafluoropropane), the deposition rates were found to be inferior.

The embodiment is intended to clarify the technical contents of the invention and should not be considered restrictive to the specific example, but can be worked out in various other forms within the spirit of the invention and within the scope of the appended claims.

For example, in each of the embodiments described above, used was a capacitively coupled type parallel plate etching apparatus. However, it is possible to use any type of the apparatus as far as it is possible to form a plasma by using the process gas defined in the present invention. For example, it is possible to use various types of the plasma processing apparatus such as the inductive coupling type plasma processing apparatus.

What is claimed is:

1. A plasma processing method for forming an α-CF film by CVD, the method comprising:
   supplying a process gas containing a fluorocarbon compound into a process chamber that accommodates a target object; and
   generating plasma of the process gas above the target object, and depositing components derived from the process gas onto the target object, thereby forming the α-CF film,
   wherein the fluorocarbon compound is 1,1,1,4,4,4-hexafluoro-2-butyne.

2. The plasma processing method according to claim 1, wherein a residence time of the process gas during said forming the α-CF film falls within a range of 0.01 to 0.1 seconds.

3. A computer readable storage medium containing a software that, when executed, causes a computer to control a plasma processing apparatus to conduct a plasma processing method for forming an α-CF film by CVD, the method comprising:
   supplying a process gas containing a fluorocarbon compound into a process chamber that accommodates a target object; and
   generating plasma of the process gas above the target object, and depositing components derived from the process gas onto the target object, thereby forming the α-CF film,
   wherein the fluorocarbon compound is selected from the group consisting of 1,1,1,4,4,4-hexafluoro-2-butyne and 1,1,1,4,4,5,5,5-octafluoro-2-pentyne.

4. A plasma processing method for forming an α-CF film by CVD, the method comprising:
   supplying a process gas containing a fluorocarbon compound into a process chamber that accommodates a target object; and
   generating plasma of the process gas above the target object, and depositing components derived from the process gas onto the target object, thereby forming the α-CF film,
   wherein the fluorocarbon compound is 1,1,1,4,4,5,5,5-octafluoro-2-pentyne.

5. The plasma processing method according to claim 4, wherein a residence time of the process gas during said forming the α-CF film falls within a range of 0.01 to 0.1 seconds.

6. A plasma processing method for etching a silicon-containing oxide film, the method comprising:
   supplying a process gas containing a fluorocarbon compound into a process chamber that accommodates a target object including the silicon-containing oxide film and a patterned photoresist film formed thereon; and
   generating plasma of the process gas above the target object, and performing an etching process on the silicon-containing oxide film through the photoresist film used as an etching mask,
   wherein the fluorocarbon compound is 1,1,1,4,4,4-hexafluoro-2-butyne.

7. The plasma processing method according to claim 6, wherein the etching process is arranged to set an etching selectivity ratio of the silicon-containing oxide film relative to the photoresist film to fall within a range 4.8 to 6.

8. The plasma processing method according to claim 6, wherein the etching process is arranged to set a residence time of the process gas to fall within a range of 0.01 to 0.1 seconds.

9. The plasma processing method according to claim 6, wherein the process gas further contains one or more rare gases selected from the group consisting of He, Ne, Ar and Xe.

10. The plasma processing method according to claim 9, wherein the process gas further contains $O_2$.

11. The plasma processing method according to claim 6, wherein the etching process is arranged to set a residence time of the process gas to fall within a range of 0.01 to 0.03 seconds.

12. A computer readable storage medium containing a software that, when executed, causes a computer to control a plasma processing apparatus to conduct a plasma processing method for etching a silicon-containing oxide film, the method comprising:
   supplying a process gas containing a fluorocarbon compound into a process chamber that accommodates a target object including the silicon-containing oxide film and a patterned photoresist film formed thereon; and
   generating plasma of the process gas above the target object, and performing an etching process on the silicon-containing oxide film through the photoresist film used as an etching mask,
   wherein the fluorocarbon compound is 1,1,1,4,4,4-hexafluoro-2-butyne.

* * * * *